(12) United States Patent
Kim et al.

(10) Patent No.: US 10,044,526 B2
(45) Date of Patent: Aug. 7, 2018

(54) TRANSMITTER AND SYSTEM INCLUDING THE SAME

(71) Applicants: SK hynix Inc., Icheon (KR); Industry-Academic Cooperation Foundation, Yonsei University, Seoul (KR)

(72) Inventors: Taewoong Kim, Seoul (KR); Woojun Choi, Jeonju (KR); Youngcheol Chae, Seoul (KR); Gunhee Han, Incheon (KR); Haekang Jung, Gwangmyeong (KR); Jongjoo Shim, Icheon (KR)

(73) Assignees: SK HYNIX INC., Icheon (KR); INDUSTRY-ACADEMIC COOPERATION FOUNDATION YONSEI UNIVERSITY, Seoul (KR)

( * ) Notice: Subject to any disclaimer, the term of this patent is extended or adjusted under 35 U.S.C. 154(b) by 0 days.

(21) Appl. No.: 15/620,394

(22) Filed: Jun. 12, 2017

(65) Prior Publication Data
US 2018/0102921 A1 Apr. 12, 2018

(30) Foreign Application Priority Data
Oct. 6, 2016 (KR) .......................... 10-2016-0129201

(51) Int. Cl.
*H04L 27/00* (2006.01)
*H04L 25/02* (2006.01)
*H03H 7/38* (2006.01)
*H03H 11/02* (2006.01)

(52) U.S. Cl.
CPC ............. *H04L 25/026* (2013.01); *H03H 7/38* (2013.01); *H03H 11/02* (2013.01)

(58) Field of Classification Search
CPC . H04L 25/026; H04L 25/4902; H04L 1/0009; H04L 1/0041; H04L 25/49; H04B 3/54; H03H 7/38; H03H 11/02
USPC .................................. 375/259, 316, 219, 295
See application file for complete search history.

(56) References Cited

U.S. PATENT DOCUMENTS 8,390,317 B2 3/2013 Bae et al.
2007/0229320 A1* 10/2007 Bae ........................ H03M 5/145
341/50

OTHER PUBLICATIONS

Jae-Yoon Sim et al., "Multilevel Differential Encoding With Precentering for High-Speed Parallel Link Transceiver", IEEE Journal of Solid-State Circuits, Aug. 2005, pp. 1688-1694, vol. 40, No. 8, IEEE.

(Continued)

*Primary Examiner* — Zedwu Kassa

(57) ABSTRACT

A transmitter may include a first transmission driver configured to drive a first transmission line according to a first input signal, a second transmission driver configured to drive a second transmission line according to a second input signal, a third transmission driver configured to drive a third transmission line according to a third input signal. The transmitter may further include a first active inductor circuit coupled to an output terminal of the first transmission driver, a second active inductor circuit coupled to an output terminal of the second transmission driver, and a third active inductor circuit coupled to an output terminal of the third transmission driver.

20 Claims, 12 Drawing Sheets

(56) References Cited

OTHER PUBLICATIONS

Kyung-Soo Ha et al., "A 0.13-µm CMOS 6 Gb/s/pin Memory Transceiver Using Pseudo-Differential Signaling for Removing Common-Mode Noise Due to SSN", IEEE Journal of Solid-State Circuits, Nov. 2009, pp. 3146-3162, vol. 44, No. 11, IEEE.

Haechang Lee et al., "A 16 GB/s/Link, 64 GB/s Bidirectional Asymmetric Memory Interface", IEEE Journal of Solid-State Circuits, Apr. 2009, pp. 1235-1247, vol. 44, No. 4, IEEE.

Sotirios Zogopoulos et al., "High-Speed Single-Ended Parallel Link Based on Three-Level Differential Encoding", IEEE Journal of Solid-State Circuits, Feb. 2009, pp. 549-557, vol. 44, No. 2, IEEE.

Junyoung Song et al., "1V 10Gb/s/pin Single-Ended Transceiver with Controllable Active-Inductor-Based Driver and Adaptively Calibrated Cascade-DFE for Post-LPDDR4 Interfaces", 2015 IEEE International Solid-State Circuits Conference, Feb. 25, 2015, pp. 320-322, IEEE.

Jaewon Lee et al., "A 2.5-Gb/s On-Chip Interconnect Transceiver With Crosstalk and ISI Equalizer in 130 nm CMOS", IEEE Transactions on Circuits and Systems-I: Regular Papers, Jan. 2012, pp. 124-136, vol. 59, No. 1, IEEE.

Meisam Honarvar Nazari et al., "A 15-Gb/s 0.5-mW/Gbps Two-Tap DFE Receiver With Far-End Crosstalk Cancellation", IEEE Journal of Solid-State Circuits, Oct. 2012, pp. 2420-2432, vol. 47, No. 10, IEEE.

Jungwon Han et al., "A Low-Power Gigabit CMOS Limiting Amplifier Using Negative Impedance Compensation and Its Application", IEEE Transactions on Very Large Scale Integration (VLSI) Systems, Mar. 2012, pp. 393-399, vol. 20, No. 3, IEEE.

Chang-Kyo Lee et al., "A 6.4Gb/s/pin at Sub-1V Supply Voltage TX-interleaving Technique for Mobile DRAM Interface", 2015 Symposium on VLSI Circuits Digest of Technical Papers, 2015, pp. C182-C183.

Hae-Kang Jung et al., "A 4.35Gb/s/pin LPDDR4 I/O Interface with Multi-VOH Level, Equalization Scheme, and Duty-Training Circuit for Mobile Applications", 2015 Symposium on VLSI Circuits Digest of Technical Papers, 2015, pp. C184-C185.

Kambiz Kaviani et al., "A 6.4Gb/s Near-Ground Single-Ended Transceiver for Dual-Rank DIMM Memory Interface Systems", 2013 IEEE International Solid-State Circuits Conference, Feb. 20, 2013, pp. 306-308, IEEE.

Tae-Young Oh et al., "A 3.2Gb/s/pin 8Gb 1.0V LPDDR4 SDRAM with Integrated ECC Engine for Sub-1V DRAM Core Operation", 2014 IEEE International Solid-State Circuits Conference, Feb. 12, 2014, pp. 430-432, IEEE.

Keunsoo Song et al., "A 1.1 V 2y-nm 4.35 Gb/s/pin 8 Gb LPDDR4 Mobile Device With Bandwidth Improvement Techniques", IEEE Journal of Solid-State Circuits, Aug. 2015, pp. 1945-1959, vol. 50, No. 8, IEEE.

Yong-Cheol Bae et al., "A 1.2V 30nm 1.6Gb/s/pin 4Gb LPDDR3 SDRAM with Input Skew Calibration and Enhanced Control Scheme", 2012 IEEE International Solid-State Circuits Conference, Feb. 20, 2012, pp. 44-46, IEEE.

\* cited by examiner

FIG. 1 <PRIOR ART>

<PRIOR ART>

<PRIOR ART>

TRANSMITTER AND SYSTEM INCLUDING THE SAME

CROSS-REFERENCE TO RELATED APPLICATION

The present application claims priority of Korean Patent Application No. 10-2016-0129201, filed on Oct. 6, 2016, which is incorporated herein by reference in its entirety.

BACKGROUND

1. Field

Embodiments of the present disclosure relate to a transmitter using a three-level transmission scheme and a system including the same.

2. Description of the Related Art

In order to reduce power consumption and a number of pins while transmitting data at high speed, a three-level transmission scheme has been proposed.

The three-level transmission scheme uses three transmission lines.

In the three-level transmission scheme, a transmitter drives the transmission lines to receive three kinds of analog signals, according to a digital signal.

A receiver may restore the digital signal by comparing the three kinds of analog signals.

FIG. 1 is a block diagram of a system including a conventional transmitter 10.

The conventional transmitter 10 includes first to third transmission drivers 11 to 13 to drive first to third transmission lines 31 to 33, respectively, according to digital input signals X1 and X2, Y1 and Y2, and Z1 and Z2. For example, the digital input signals X1 and X2, Y1 and Y2, and Z1 and Z2 determine one or more of output voltages, abilities to sink current, and abilities to source current of the first to third transmission drivers 11 to 13, respectively.

At this time, each of the digital input signals X1, X2, Y1, Y2, Z1, and Z2 may include a signal obtained by encoding a digital signal to be transmitted.

A conventional receiver 20 includes first to third termination resistors R1 to R3 having first ends connected to the first to third transmission lines 31 to 33, respectively.

Second ends of the first to third termination resistors R1 to R3 are connected to a common node N.

The receiver 20 may further include first to third reception drivers 21 to 23 respectively connected to output terminals of the first to third transmission lines 31 to 33.

The first reception driver 21 compares a first output signal of the first transmission line 31 and a second output signal of the second transmission line 32 to output a first signal Xo, the second reception driver 22 compares the second output signal of the second transmission line 32 and a third output signal of the third transmission line 33 to output a second signal Yo, and the third reception driver 23 compares the third output signal of the third transmission line 33 and the first output signal of the first transmission line 31 to output a third signal Zo.

The receiver 20 can restore the transmitted digital signal by decoding the first, second, and third signals Xo, Yo, and Zo.

FIGS. 2 and 3 are diagrams for illustrating a conventional signal transmission process.

The first transmission driver 11 includes a first switch SW11, a first resistor R11, a second resistor R12, and a second switch SW12, which are connected in series between a supply voltage VDD and a ground, and a common connection terminal between the first resistor R11 and the second resistor R12 is connected to the first transmission line 31.

The second transmission driver 12 includes a third switch SW21, a third resistor R21, a fourth resistor R22, and a fourth switch SW22, which are connected in series between the supply voltage VDD and the ground, and a common connection terminal between the third resistor R21 and the fourth resistor R22 is connected to the second transmission line 32.

The third transmission driver 13 includes a fifth switch SW31, a fifth resistor R31, a sixth resistor R32, and a sixth switch SW32, which are connected in series between the supply voltage VDD and the ground, and a common connection terminal between the fifth resistor R31 and the sixth resistor R32 is connected to the third transmission line 33.

For example, the first resistor R11, the second resistor R12, the third resistor R21, the fourth resistor R22, the fifth resistor R31, the sixth resistor R32, and the termination resistors R1 to R3 have the same resistance value.

In FIG. 2, the first and second transmission drivers 11 and 12 operate while an output terminal of the third transmission driver 13 is in a floating state.

At this time, the first switch SW11 and the fourth switch SW22 are turned on, and the second switch SW12, the third switch SW21, the fifth switch SW31, and the sixth switch SW32 are turned off.

Thus, the first transmission line 31 has an output voltage level of 0.75 VDD, the second transmission line 32 has an output voltage level of 0.25 VDD, and the third transmission line 33 has a nominal output voltage level of 0.5 VDD.

However, since the third transmission line 33 is in the floating state, the output voltage level is not maintained substantially equal to 0.5 VDD, due to the influence of noise. The noise may be amplified by reflections of cross-talk signals at third transmission line 33. Thus, an eye diagram of the output voltage of the third transmission line 33 may have a small size of an eye opening.

In FIG. 3, the first and second transmission drivers 11 and 12 operate, while a constant current flows through the fifth and sixth resistors R31 and R32 in the third transmission driver 13.

That is, a first current I1 flows through the first and second transmission lines 31 and 32, and a second current I2 flows through the fifth resistor R31 and the sixth resistor R32.

At this time, the first switch SW11, the fourth switch SW22, the fifth switch SW31 and the sixth switch SW32 are turned on, and the second switch SW12 and the third switch SW21 are turned off.

Thus, the first transmission line 31 has the output voltage level of 0.75 VDD, and the second transmission line 32 has the output voltage level of 0.25 VDD.

Because the constant current I2 causes an input voltage level of the transmission line 33 to maintain substantially equal to 0.5 VDD, the third transmission line 33 may maintain the output voltage level substantially equal to 0.5 VDD. However, power consumption may be increased due to the second current I2 flowing in the third transmission driver 13.

Furthermore, the conventional system has a limitation in increasing resistance values of the termination resistors R1, R2, and R3 as well as the other resistors R11, R12, R21, R22, R31, and R32 included in the transmission drivers 11, 12, and 13, due to impedance matching issues. Because the resistance values cannot exceed a specific value, magnitudes of the first and second currents I1 and I2 may be increased, thereby increasing the power consumption.

SUMMARY

Various embodiments are directed to a transmitter which is capable of reducing power consumption in a three-level transmission device without degrading characteristics of an output signal, and a system including the same.

In an embodiment, a transmitter may include: a first transmission driver configured to drive a first transmission line according to a first input signal; a second transmission driver configured to drive a second transmission line according to a second input signal; a third transmission driver configured to drive a third transmission line according to a third input signal; a first active inductor circuit coupled to an output terminal of the first transmission driver; a second active inductor circuit coupled to an output terminal of the second transmission driver; and a third active inductor circuit coupled to an output terminal of the third transmission driver.

In an embodiment, a system may include a transmitter, a receiver, and first, second, and third transmission lines, the first second, and third transmission lines being configured to couple the transmitter and the receiver. The transmitter may include: a first transmission driver configured to drive a first transmission line according to a first input signal; a second transmission driver configured to drive a second transmission line according to a second input signal; a third transmission driver configured to drive a third transmission line according to a third input signal; a first active inductor circuit coupled to an output terminal of the first transmission driver; a second active inductor circuit coupled to an output terminal of the second transmission driver; and a third active inductor circuit coupled to an output terminal of the third transmission driver, and the receiver may include: a first termination resistor coupled between a first terminal of the first transmission line and a common node; a second termination resistor coupled between a first terminal of the second transmission line and the common node; and a third termination resistor coupled between a first terminal of the third transmission line and the common node.

DETAILED DESCRIPTION

Hereafter, various embodiments will be described with reference to the accompanying drawings.

Figure 4:
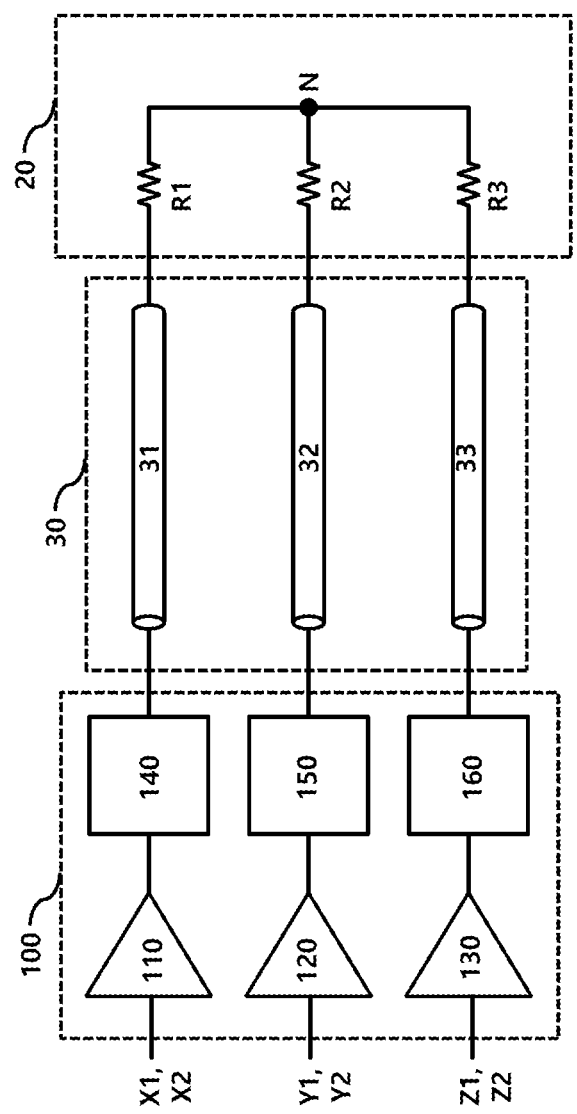
FIG. 4 is a block diagram illustrating a system including a transmitter according to an embodiment.

FIG. 4 is a block diagram of a system including a transmitter 100 according to an embodiment.

The system further includes a receiver 20 and a transmission line 30. The receiver 20 includes first to third termination resistors R1 to R3, and the transmission line 30 includes first to third transmission lines 31 to 33.

First ends of the first to third termination resistors R1 to R3 are coupled to the first to third transmission lines 31 to 33, respectively, and second ends of the first to third termination resistors R1 to R3 are coupled to a common node N.

The transmitter 100 includes first to third transmission drivers 110 to 130 and first to third active inductor circuits 140 to 160.

Each of the active inductor circuits 140, 150, and 160 includes an active element such as FET (Field Effect Transistor), and operates with an inductor characteristic. Specifically, such an active inductor has an impedance value that increases as a frequency increases, and thus may be considered as an inductive load.

The active inductor circuit 140, 150, or 160 has a function of improving a gain at a high frequency.

The transmission line 31, 32, or 33 exhibits a frequency characteristic of a low-pass filter. In the embodiment shown in FIG. 4, a bandwidth of a signal passed through the transmission line 31, 32, or 33 may be increased by the coupled active inductor circuit 140, 150, or 160, respectively, of the transmitter 100.

First and second input signals X1 and X2 are applied to the first transmission driver 110, and an output signal of the first transmission driver 110 is applied to the first transmission line 31.

The first active inductor circuit 140 is coupled to an output terminal of the first transmission driver 110.

Third and fourth input signals Y1 and Y2 are applied to the second transmission driver 120, and an output signal of the second transmission driver 120 is applied to the second transmission line 32.

The second active inductor circuit 150 is coupled to an output terminal of the second transmission driver 120.

Fifth and sixth input signals Z1 and Z2 are applied to the third transmission driver 130, and an output signal of the third transmission driver 130 is applied to the third transmission line 33.

The third active inductor circuit 160 is coupled to an output terminal of the third transmission driver 130.

In the embodiment shown in FIG. 4, the first to sixth input signals X1 to Z2 may be respective signals obtained by encoding a digital signal to be transmitted.

Furthermore, when signals are transmitted, two of the first to third transmission drivers 110 to 130 operate, and an output terminal of the remaining one is in a floating state.

Figure 5:
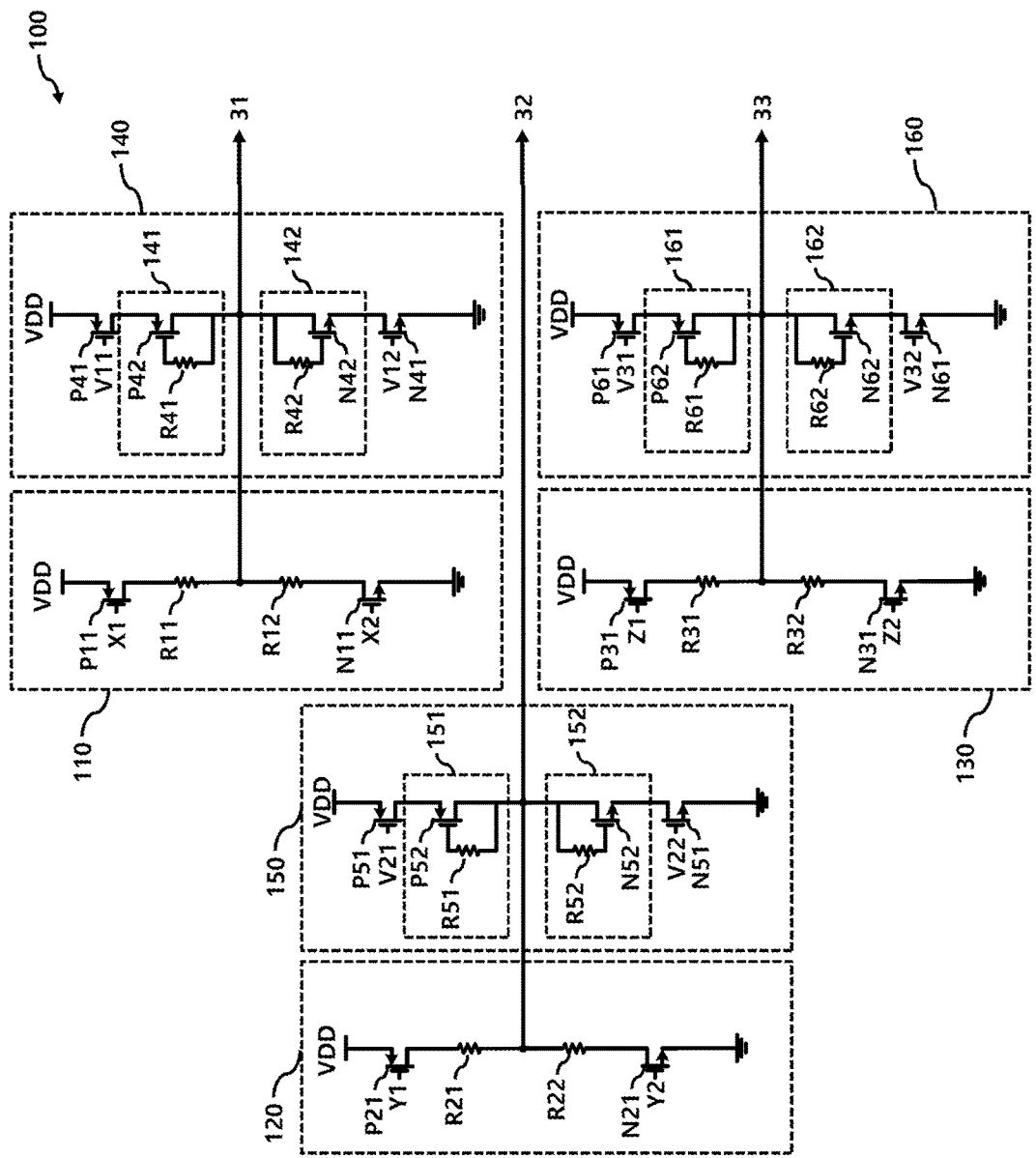
FIG. 5 is a circuit diagram illustrating the transmitter of FIG. 4 according to an embodiment.

FIG. 5 is a circuit diagram illustrating the transmitter 100 of FIG. 4 according to an embodiment.

The first transmission driver 110 includes a first PMOS transistor P11, a first resistor R11, a second resistor R12 and a first NMOS transistor N11, which are connected in series between a supply voltage VDD and a ground.

The first PMOS transistor P11 receives a first input signal X1 through the gate thereof, and the first NMOS transistor N11 receives a second input signal X2 through the gate thereof.

An output signal of the first transmission driver 110 is provided to a first transmission line 31 through a common connection node between the first resistor R11 and the second resistor R12.

A first active inductor circuit 140 includes a second PMOS transistor P41, a third PMOS transistor P42, a second NMOS transistor N42, and a third NMOS transistor N41, which are connected in series between the supply voltage VDD and the ground.

The second PMOS transistor P41 receives a first control signal V11 through the gate thereof, and the third NMOS transistor N41 receives a second control signal V12 through the gate thereof.

Between the gate and a drain of the third PMOS transistor P42, a third resistor R41 is coupled, and between the gate and the drain of the second NMOS transistor N42, a fourth resistor R42 is coupled.

The third PMOS transistor P42 and the third resistor R41 operate as a first active inductor 141, the second NMOS transistor N42 and the fourth resistor R42 operate as a second active inductor 142, and the second PMOS transistor P41 and the third NMOS transistor N41 operate as switch devices.

The drain of the third PMOS transistor P42 and the drain of the second NMOS transistor N42 are coupled to the output terminal of the first transmission driver 110.

The first active inductor circuit 140 may increase a bandwidth of a signal which is output from the first transmission driver 110 and transmitted to the first transmission line 31.

The second transmission driver 120 includes a fourth PMOS transistor P21, a fifth resistor R21, a sixth resistor, and a fourth NMOS transistor N21, which are connected in series between the supply voltage VDD and the ground.

The fourth PMOS transistor P21 receives the third input signal Y1 through the gate thereof, and the fourth NMOS transistor N21 receives the fourth input signal Y2 through the gate thereof.

An output signal of the second transmission driver 120 is provided to the second transmission line 32 through a common connection node between the fifth resistor R21 and the sixth resistor R22.

The second active inductor circuit 150 includes a fifth PMOS transistor P51, a sixth PMOS transistor P52, a fifth NMOS transistor N52, and a sixth NMOS transistor N51, which are connected in series between the supply voltage VDD and the ground.

The fifth PMOS transistor P51 receives a third control signal V21 through the gate thereof, and the sixth NMOS transistor N51 receives a fourth control signal V22 through the gate thereof.

Between the gate and a drain of the sixth PMOS transistor P52, a seventh resistor R51 is coupled, and between the gate and a drain of the fifth NMOS transistor N52, an eighth resistor R52 is coupled.

The sixth PMOS transistor P52 and the seventh resistor R51 operate as a third active inductor 151, the fifth NMOS transistor N52 and the eighth resistor R52 operate as a fourth active inductor 152, and the fifth PMOS transistor P51 and the sixth NMOS transistor N51 operate as switch devices.

The drain of the sixth PMOS transistor P52 and the drain of the fifth NMOS transistor N52 are coupled to the output terminal of the second transmission driver 120.

The second active inductor circuit 150 may increase a bandwidth of a signal which is output from the second transmission driver 120 and transmitted to the second transmission line 32.

The third transmission driver 130 includes a seventh PMOS transistor P31, a ninth resistor R31, a tenth resistor R32, and a seventh NMOS transistor N31, which are connected in series between the supply voltage VDD and the ground.

The seventh PMOS transistor P31 receives the fifth input signal Z1 through the gate thereof, and the seventh NMOS transistor N31 receives the sixth input signal Z2 through the gate thereof.

An output signal of the third transmission driver 130 is provided to the third transmission line 33 through a common connection node between the ninth resistor R31 and the tenth resistor R32.

The third active inductor circuit 160 includes an eighth PMOS transistor P61, a ninth PMOS transistor P62, an eighth NMOS transistor N62 and a ninth NMOS transistor N61, which are connected in series between the supply voltage VDD and the ground.

The eighth PMOS transistor P61 receives a fifth control signal V31 through the gate thereof, and the ninth NMOS transistor N61 receives a sixth control signal V32 through the gate thereof.

Between the gate and a drain of the ninth PMOS transistor P62, an eleventh resistor R61 is coupled, and between the gate and a drain of the eighth NMOS transistor N62, a twelfth resistor R62 is coupled.

The ninth PMOS transistor P62 and the eleventh resistor R61 operate as a fifth active inductor 161, the eighth NMOS transistor N62 and the twelfth resistor R62 operate as a sixth active inductor 162, and the eighth PMOS transistor P61 and the ninth NMOS transistor N61 operate as switch devices.

The drain of the ninth PMOS transistor P62 and the drain of the eighth NMOS transistor N62 are coupled to the output terminal of the third transmission driver 130.

The third active inductor circuit 160 may increase a bandwidth of a signal which is output from the third transmission driver 130 and transmitted to the third transmission line 33.

Figure 6:
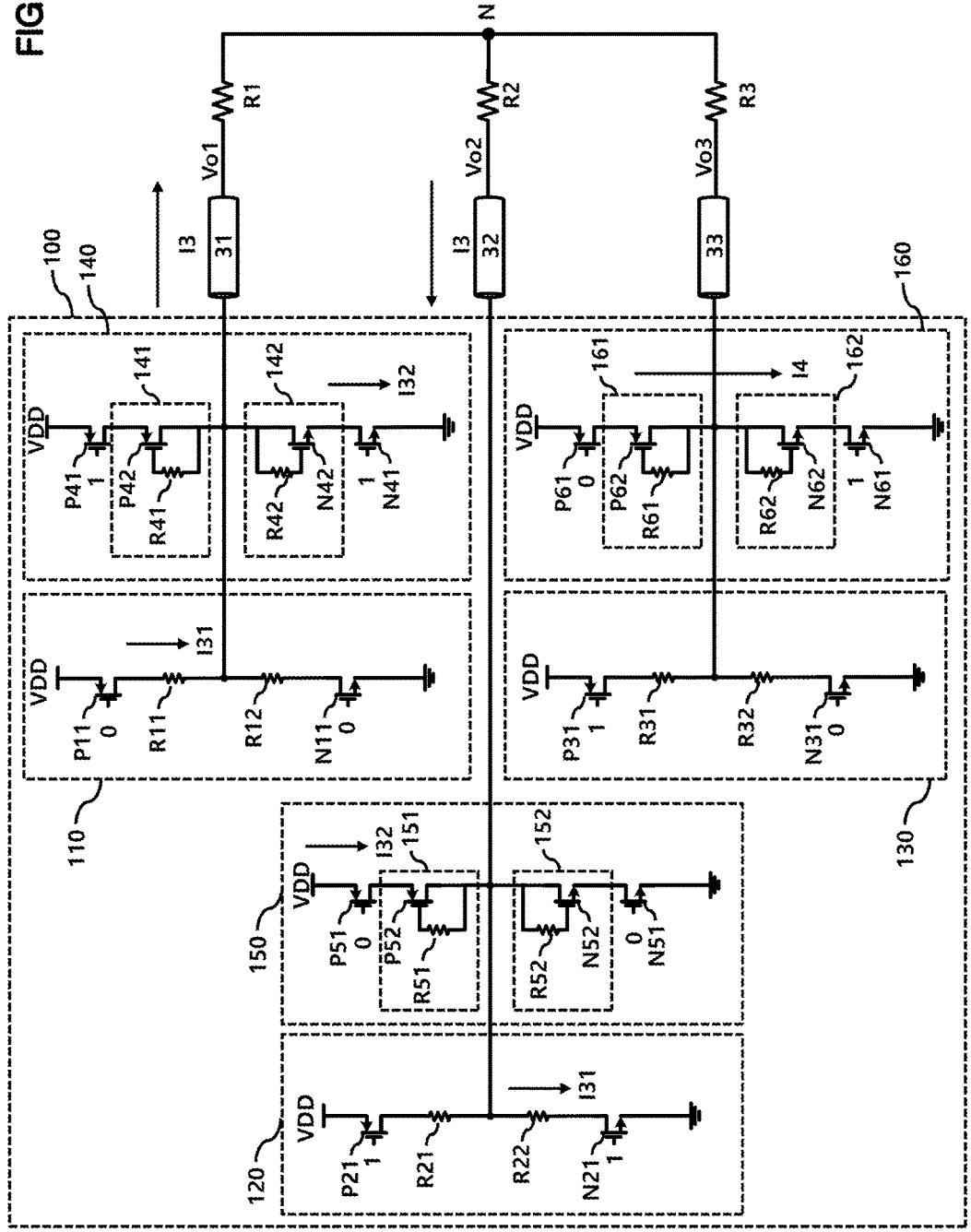
FIG. 6 is a diagram illustrating an operation of the transmitter of FIG. 4 according to an embodiment.

FIG. 6 illustrates an operation of the transmitter 100 of FIG. 5.

In the following descriptions, a reference character "0" represents a signal corresponding to a low-level voltage lower than a threshold voltage of a transistor, and a reference character "1" represents a signal corresponding to a high-level voltage higher than the threshold voltage of the transistor.

Thus, in FIG. 6, the low-level voltage 0 may be applied to the gates of the transistors P11, N11, P51, N51, N31, and P61, and the high-level voltage 1 may be applied to the gates of the transistors P41, N41, P21, N21, P31, and N61.

In FIG. 6, the first and second input signals X1 and X2 are set to 0, the third and fourth input signals Y1 and Y2 are set to 1. The fifth and sixth input signals Z1 and Z2 are set to 0 and 1, respectively.

Thus, in the first transmission driver 110, the first PMOS transistor P11 is turned on, and the first NMOS transistor N11 is turned off.

In the second transmission driver 120, the fourth NMOS transistor N21 is turned on, and the fourth PMOS transistor P21 is turned off.

In the third transmission driver 130, the seventh NMOS transistor N31 and the seventh PMOS transistor P31 are all turned off.

Furthermore, the first and second control signals V11 and V12 are set to 1, the third and fourth control signals V21 and V22 are set to 0. The fifth and sixth control signals V31 and V32 are set to 0 and 1, respectively.

Thus, in the first active inductor circuit 140, the second PMOS transistor P41 is turned off, and the third NMOS transistor N41 is turned on. Then, the second active inductor 142 is coupled between the output terminal of the first transmission driver 110 and the ground.

In the second active inductor circuit 150, the fifth PMOS transistor P51 is turned on, and the sixth NMOS transistor N51 is turned off. Then, the third active inductor 151 is coupled between the supply voltage VDD and the output terminal of the second transmission driver 120.

In the third active inductor circuit 160, the eighth PMOS transistor P61 is turned on, and the ninth NMOS transistor N61 is turned on. Then, the fifth active inductor 161 is coupled between the supply voltage VDD and the output terminal of the third transmission driver 130, and the sixth active inductor 162 is coupled between the output terminal of the third transmission driver 130 and the ground.

Thus, a first current I3 flows through the first transmission line 31, the common node N, and the second transmission line 32, and substantially no current flows through the third transmission line 33. The first transmission line 31 has a first terminal coupled to the output terminal of the first transmission driver 110 and a second terminal coupled to the common node N. The second transmission line 32 has a first terminal coupled to the output terminal of the second transmission driver 120 and a second terminal coupled to the common node N. The third transmission line 33 has a first terminal coupled to the output terminal of the third transmission driver 130 and a second terminal coupled to the common node N.

In the embodiment of FIG. 6, a second current I31 flows through the first and sixth resistors R11 and R22, and a third current I32 flowing through the second active inductor 142 and the third active inductor 151.

A voltage VN at the common node N may be expressed as Equations 1 and 2:

$$VN=VDD-R11 \times I31-R1 \times I3;\text{ and}$$ [Equation 1]

$$VN=R22 \times I31+R2 \times I3.$$ [Equation 2]

In the embodiment of FIG. 6, the first and second resistors R11 and R12 have substantially the same resistance value, and the first and second termination resistors R1 and R2 have substantially the same resistance value.

Thus, by summing Equations 1 and 2, the voltage VN at the common node N may be obtained as Equation 3 below:

$$VN=VDD/2.$$ [Equation 3]

Thus, an output voltage Vo1 at a first terminal of the first transmission line 31 may be expressed as Equation 4 below, and an output voltage Vo1 at a first terminal of the second transmission line 32 may be expressed as Equation 5 below:

$$Vo1=VDD/2+R1 \times I3;\text{ and}$$ [Equation 4]

$$Vo2=VDD/2-R2 \times I3.$$ [Equation 5]

In the third active inductor circuit 160, a fourth current I4 flows from the supply voltage VDD to the ground such that a voltage at the output terminal of the third transmission driver 130 is maintained substantially equal to VDD/2. Because the first terminal of the third transmission line 33 is connected to the output terminal of the third transmission driver 130 and substantially no current flows through the third transmission line, an output voltage Vo3 at the second terminal of the third transmission line 33 is also maintained substantially equal to VDD/2.

Figure 1:
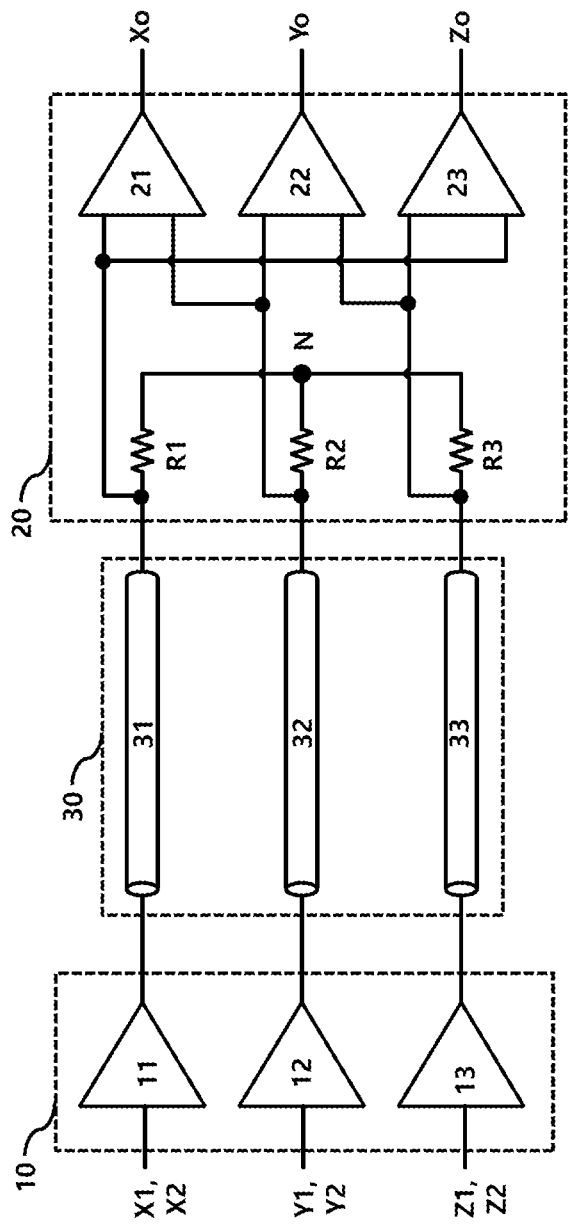
FIG. 1 is a block diagram of a system including a conventional transmitter.
Figure 2:
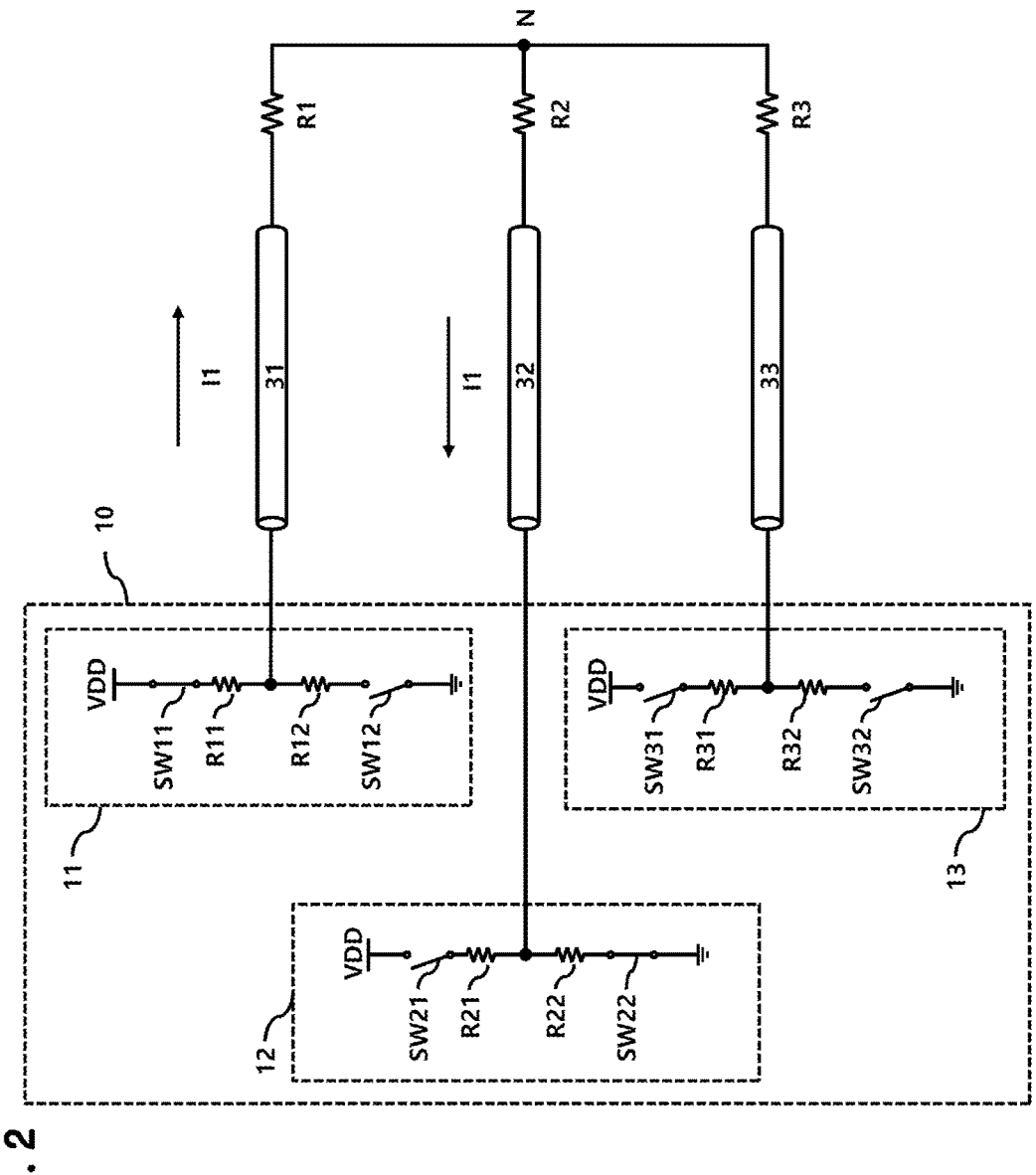
FIGS. 2 and 3 are diagrams for illustrating driving operations of the conventional transmitter of FIG. 1.
Figure 3:
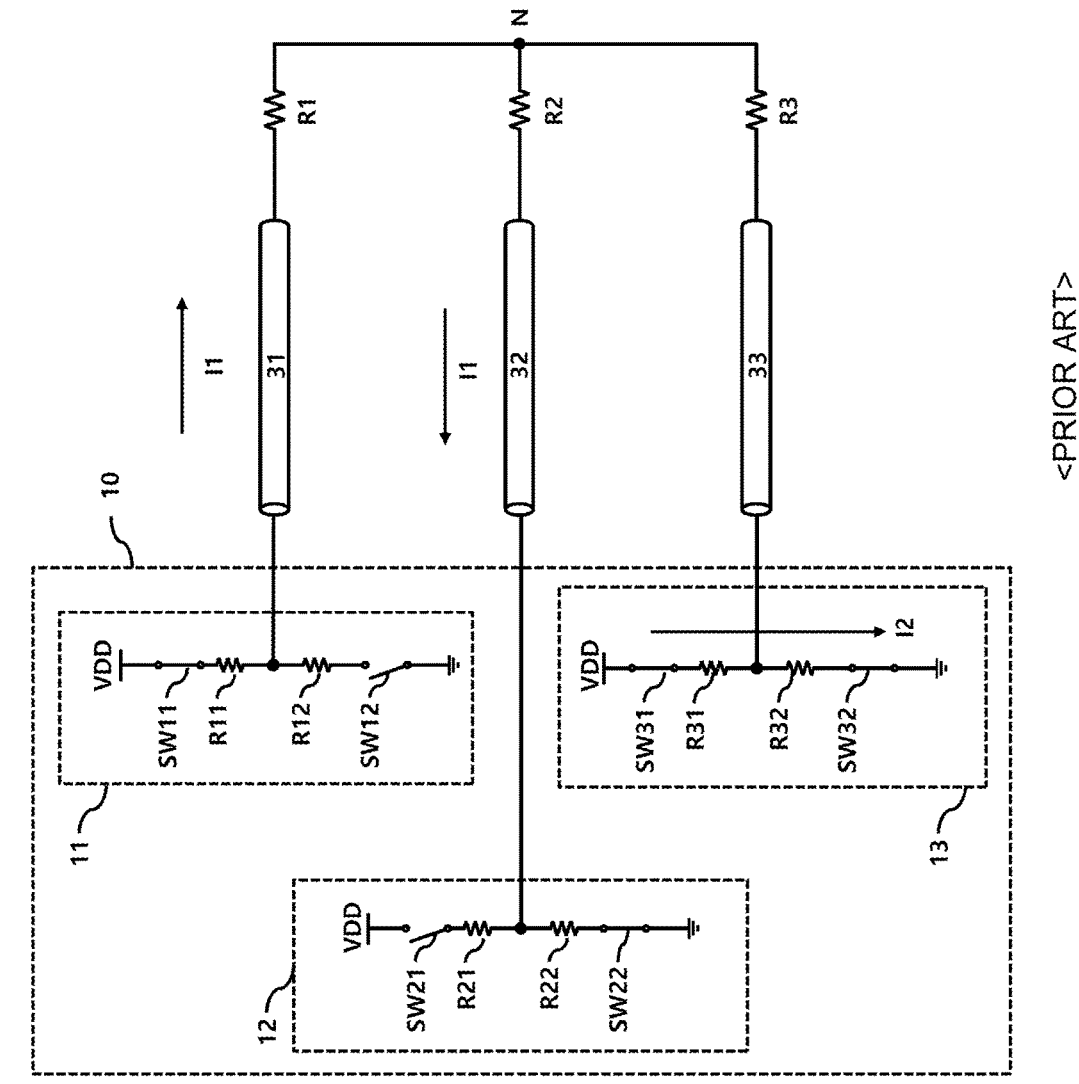

In the embodiment of FIG. 6, because the active inductors 141, 142, 151, 152, 161, and 162 are used in the transmitter 100, resistance values of the resistors R11, R12, R21, R22, R31, and R32 included in the transmission drivers 110, 120, and 130 may be greater than those of corresponding resistors (e.g., the resistors R11, R12, R21, R22, R31, and R32 of FIG. 3) in a conventional transmitter (e.g., the transmitter 10 of FIG. 3).

For example, in such a conventional transmitter (e.g., the transmitter 10 of FIG. 3) that does not include any active inductor, when a characteristic impedance of a transmission line (e.g., the first transmission line 31 of FIG. 3) of the conventional transmitter is 50Ω, a resistance value of a resistor (e.g., the first resistor R11 of FIG. 3) included in a transmission driver (e.g., the first transmission driver 11 of FIG. 3) of the conventional transmitter for impedance matching needs to be 50Ω for impedance matching. When the supply voltage VDD is 1V, the second current I2 flowing through the fifth and sixth resistors R31 and R32, each of which has the resistance value of 50Ω, in the third transmission driver 13 of the transmitter 10 is 10 mA.

Because a transmitter according to an embodiment of the present disclosure includes one or more of active inductors, impedance matching is achieved even though resistance values of resistors included in one or more of transmission drivers of the transmitter may be greater than the resistance values (e.g., 50Ω) of the resistors in the conventional transmitter (e.g., the transmitter 10 of FIG. 3).

Referring back to FIG. 6, in an embodiment, each of the resistance values of the resistors R11, R12, R21, R22, R31, and R32 included in the transmission drivers 110, 120, and 130 may be substantially equal to 250Ω, and resistance values of the termination resistors R1 to R3 may be substantially equal to 250 g.

Thus, a magnitude of the second current I31 flowing through the resistors R11 and R22 in the transmission drivers 110 and 120 of FIG. 6 is smaller than a magnitude of the first current I1 flowing through the resistor R11 and R22 in the transmission drivers 11 and 12 of FIG. 3.

Furthermore, since the voltage of the output terminal of the first transmission driver 110 is larger than VDD/2, the magnitude of the third current I32 flowing through the second active inductor 142 becomes larger than the magnitude of the fourth current I4 flowing through the sixth active inductor 162.

Because the second current I31 is equal to a sum of the first current I3 and the third current I32, the magnitude of the second current I31 is larger than the magnitude of the third current I32. Because the magnitude of the third current I32 is larger than the magnitude of the fourth current I4, the magnitude of the fourth current I4 is much smaller than the magnitude of the second current I31. Because the magnitude of the second current I31 of FIG. 6 is smaller than the magnitude of the first current I1 of FIG. 3, which is equal to or greater than the second current I2 of FIG. 3, the fourth current I4 of FIG. 6 becomes much smaller than the second current I2 of FIG. 3.

As a result, a sum of the second current I31 and the fourth current I4, which corresponds to a magnitude of a total current supplied from the power supply VDD of the transmitter 100, becomes smaller than a total current, which corresponds to a sum of the first current I1 and the second current I2 of FIG. 3 in the conventional transmitter 10.

According to the embodiment of FIG. 6, the transmitter 100 may use the third active inductor circuit 160 in place of the third transmission driver 13 of FIG. 3, to substantially prevent floating of the output terminal of the third transmission driver 130. Because the fourth current I4 flowing in the third active inductor circuit 160 of FIG. 6 is smaller than the second current I2 flowing in the third transmitter driver 13 of FIG. 3, the transmitter 100 can reduce power consumption while preventing degradation of eye characteristics, compared to the conventional transmitter 10 of FIG. 3.

Figure 7:
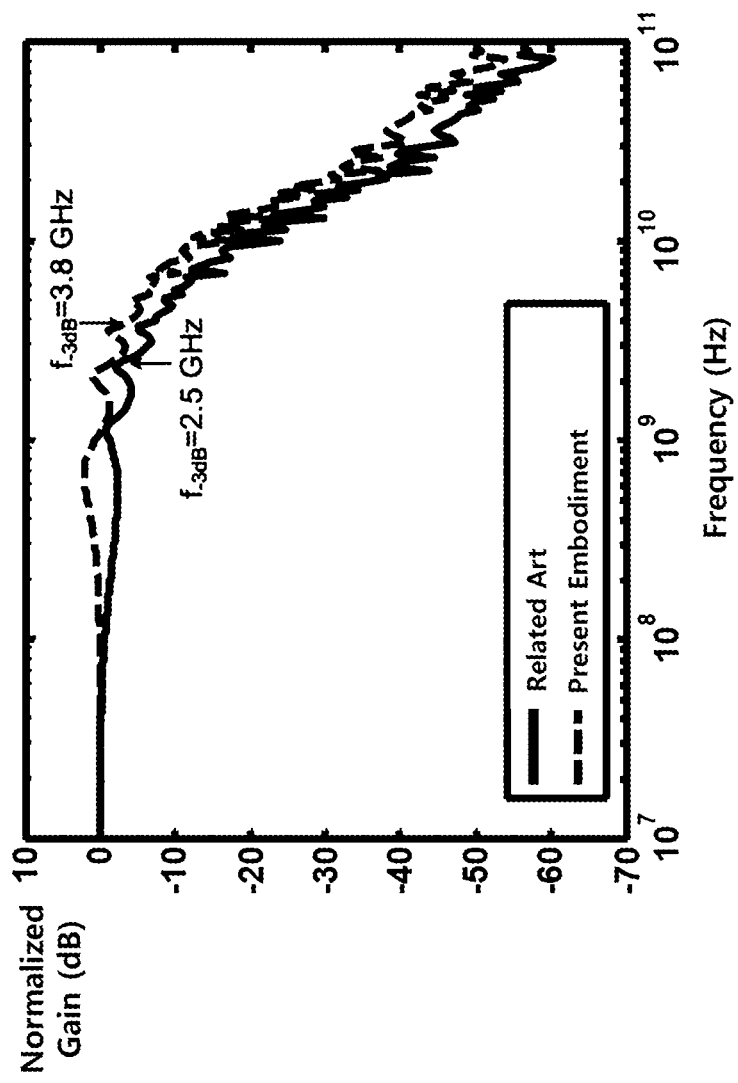
FIG. 7 illustrates frequency characteristics of a conventional transmitter and a transmitter according to an embodiment of the present disclosure.

FIG. 7 illustrates frequency characteristics of a conventional transmitter and a transmitter according to an embodiment (e.g., the transmitter 100 of FIG. 6). Specifically, FIG. 7 shows an increase of a bandwidth of the transmitter according to the embodiment compared to the conventional transmitter.

Referring to FIG. 7, the bandwidth, measured at a −3 decibel cutoff frequency, of the conventional transmitter without an active inductor is 2.5 GHz, while the bandwidth of the transmitter according to the embodiment using the active inductors is increased to 3.8 GHz.

Figure 8:
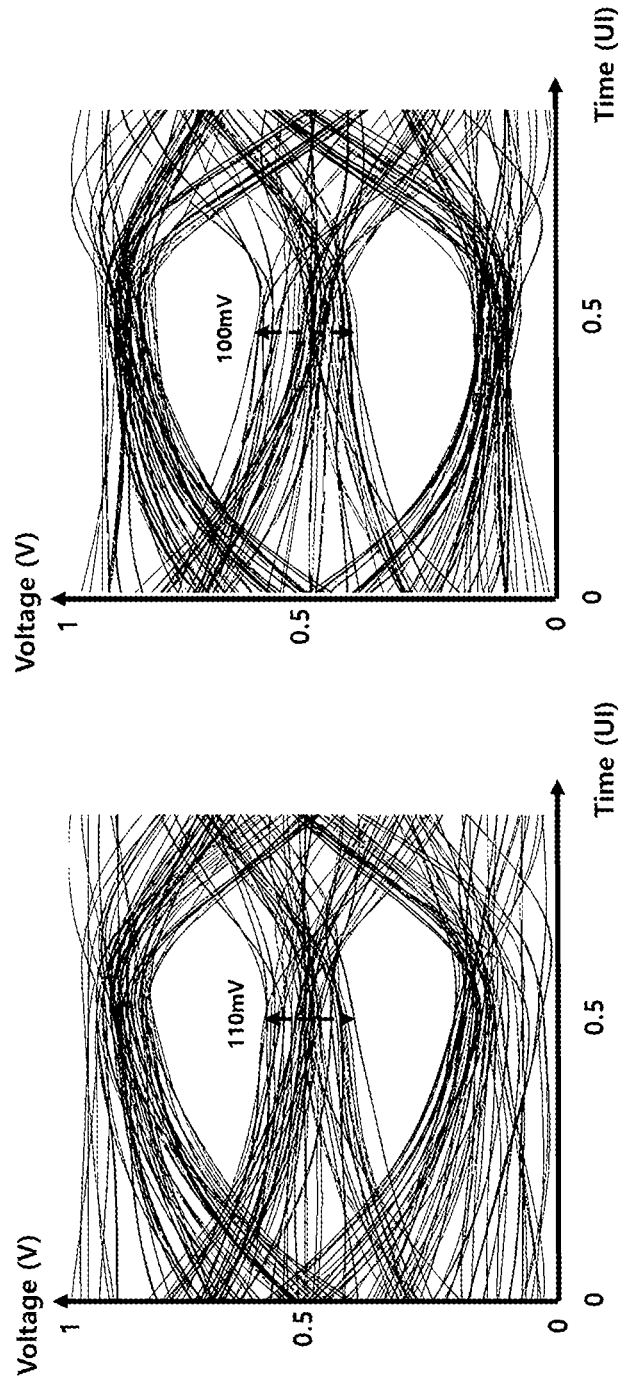
FIGS. 8A and 8B are eye diagrams of a conventional transmitter and a transmitter according to an embodiment, respectively.

FIG. 8A illustrates eye characteristics of the conventional transmitter 10 of FIG. 3, and FIG. 8B illustrates eye characteristics of a transmitter (e.g., the transmitter 100 of FIG. 6) according to an embodiment. Specifically, FIGS. 8A and 8B illustrate the respective eye characteristics as a function of a Unit Interval UI that corresponds to a specific time interval (e.g., from 0.5 ns to 1 ns).

As illustrated in FIGS. 8A and 8B, the transmitter according to the embodiment exhibits eye characteristics (e.g., an eye width, an eye height, and the like) similar to the conventional transmitter, while consuming a smaller amount of power.

Figure 9:
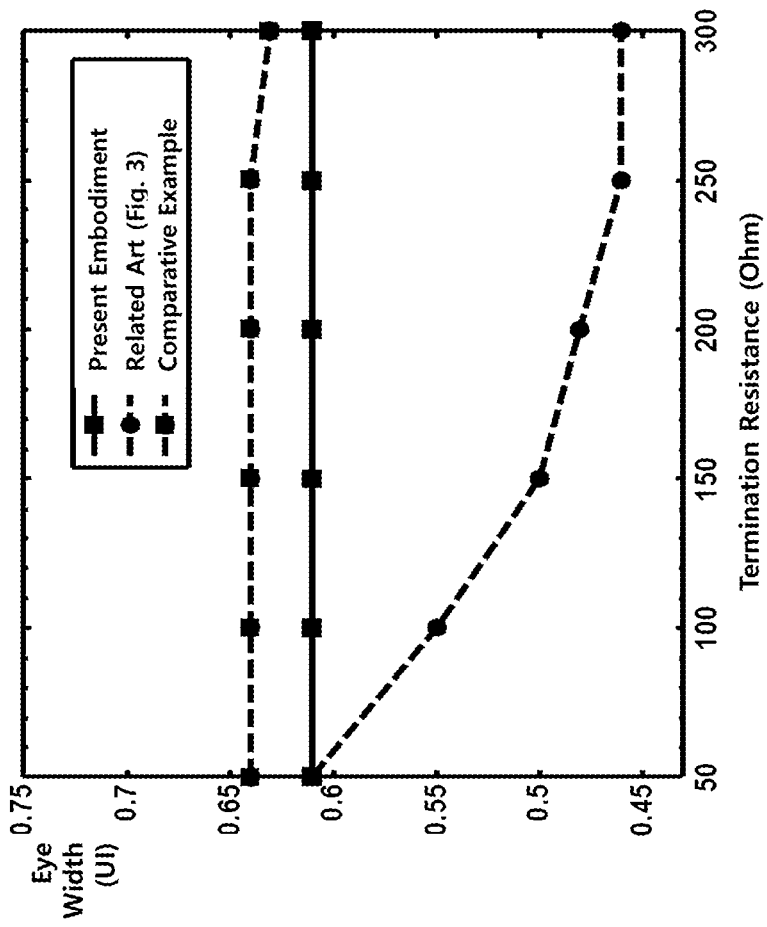
FIG. 9 illustrates magnitudes of eye widths of a conventional transmitter, a comparative example, and a transmitter according to an embodiment of the present disclosure, depending on a resistance value of a termination resistor.

FIG. 9 illustrates eye widths of a transmitter according to an embodiment of the present disclosure, a conventional transmitter, and a comparative example, corresponding to a resistance value of each of termination resistors. Specifically, FIG. 9 illustrates the eye widths in a Unit Interval UI that corresponds to a specific terminal resistance (e.g., from 50 ohm to 300 ohm).

In FIG. 9, a first dotted line marked with circles and labeled Related Art represents the conventional transmitter 10 of FIG. 3, and a solid line Present Embodiment represents the transmitter 100 of FIG. 6 according to the embodiment. A second dotted line marked with squares and labeled Comparative Example represents a comparative example having the same configuration as the transmitter 100 of FIG. 6 except that a constant current flows through the resistors R31 and R32 in the third transmission driver 130 in FIG. 6, rather than flowing through the active inductors 161 and 162 in the third active inductor circuit 160, to substantially prevent the common node N from floating.

As illustrated in FIG. 9, the eye widths of the conventional transmitter 10 shown as Related Art considerably decreases when the resistance value of each of the termination resistors become larger than 50 g. That is because impedance matching fails when the resistance value of the termination resistor becomes larger than 50Ω.

In the transmitter 100 of FIG. 6 according to the embodiment, as indicated by the solid line Present Embodiment, however, since the active inductors are used, impedance matching does not fail even though the resistance value of each of the termination resistors increases. As a result, the eye widths are maintained substantially constant when the resistance value increases.

In the comparative example, as indicated by the second dotted line Comparative Example, since the active inductors are used while the third transmission driver 130 in FIG. 6 functions to prevent floating of the common node N, the eye widths are slightly improved, compared to corresponding eye widths of the transmitter 100 according to the embodiment. However, the comparative example may consume more power than the transmitter 100 according to the embodiment will be described below with reference to FIG. 10.

Figure 10:
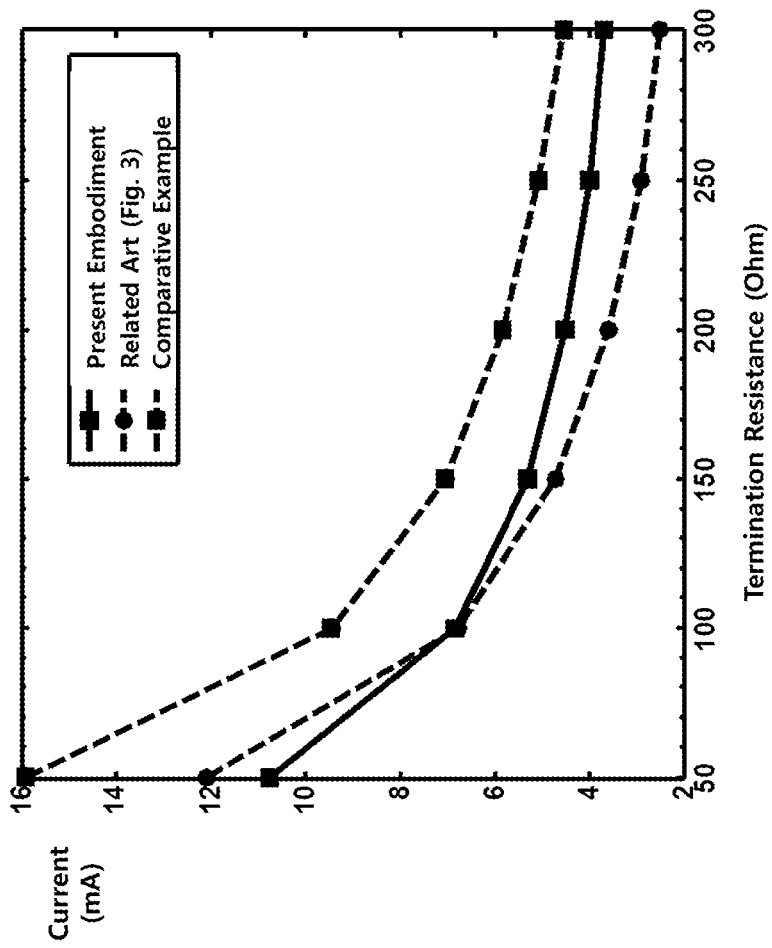
FIG. 10 illustrates magnitudes of consumed currents of a conventional transmitter, a comparative example, and a transmitter according to an embodiment of the present disclosure, depending on a resistance value of a termination resistor.

FIG. 10 illustrates magnitudes of consumed currents in a transmitter according to an embodiment of the present disclosure, a conventional transmitter, and a comparative example, depending on a resistance value of a termination resistor.

When the resistance value of the termination resistor increases, the magnitude of each of the currents decreases. The magnitudes of the currents in the transmitter according to the embodiment, the conventional transmitter, and the comparative example are respectively indicated by a solid line labeled Present Embodiment, a first dotted line marked with circles and labeled Related Art, and a second dotted line marked with squares and labeled Comparative Example.

In the comparative example, as indicated by the second dotted line Comparative Example, since the third transmission driver 130 functions to prevent floating of the common node N, a magnitude of the current in the comparative example is always greater than a corresponding magnitude of the current in the transmitter according to the embodiment at the same resistance value, regardless of the resistance value of the termination resistor. Thus, the comparative example consumes more power than the transmitter according to the embodiment of the present disclosure.

In the transmitter according to the embodiment, when the resistance value of the termination resistor is equal to or less than 100Ω, a magnitude of a current is smaller than a corresponding magnitude of a current consumed in the conventional transmitter at the same resistance value of the termination resistor. In contrast, when the resistance value of the termination resistor exceeds 100Ω, a magnitude of the current in the transmitter according to the embodiment is greater than a corresponding magnitude of the current used in the conventional transmitter at the same resistance value of the termination resistor.

However, as illustrated in FIG. 9, when the resistance value of the termination resistor exceeds 50Ω, the eye characteristics is significantly degraded in the conventional transmitter. Thus, the resistance value of the termination resistor in the conventional transmitter cannot exceed 100Ω, which is greater than 50Ω. In contrast, the transmitter according to the embodiment may include the termination resistor having the resistance value equal to 250Ω, resulting in a relatively low current compared to the conventional transmitter. Thus, the transmitter of the embodiment has considerably lower power consumption than the conventional transmitter including the termination resistor having the resistance value equal to 50Ω.

Figure 11:
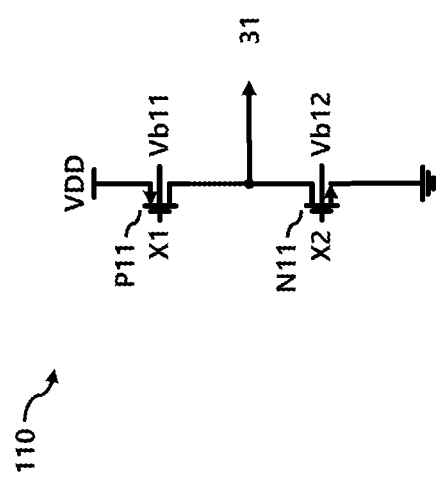
FIG. 11 is a circuit diagram illustrating a first transmission driver of FIG. 5 according to another embodiment.

FIG. 11 is a circuit diagram of the first transmission driver 110 of FIG. 4 according to another embodiment.

In the embodiment of FIG. 11, the first transmission driver 110 includes a first PMOS transistor P11 and a first NMOS transistor N11. A source of the first PMOS transistor P11 is coupled to a supply voltage VDD, and a drain of the first PMOS transistor P11 is coupled to an output terminal of the first transmission driver 110. A drain of the first NMOS transistor N11 is coupled to the output terminal and a source of the first NMOS transistor N11 is coupled to a ground. The first transmission driver 110 drives the first transmission line 31.

A first input signal X11 is input to a gate of the first PMOS transistor P11, and a second input signal X12 is input to a gate of the first NMOS transistor N11. This configuration is similar to that of the first transmission driver 110 of FIG. 5 except that the first and second resistor R11 and R12 of FIG. 5 are omitted.

In the first transmission driver 110 according to the embodiment, a first bulk control signal Vb11 is input to a back gate of the first PMOS transistor P11, and a second bulk control signal Vb12 is input to a back gate of the first NMOS transistor N11.

The first bulk control signal Vb11 controls a turn-on resistance of the first PMOS transistor P11, and the second bulk control signal Vb12 controls a turn-on resistance of the first NMOS transistor N11.

In the first transmission driver 110 according to the embodiment of FIG. 11, resistors (e.g., the resistors R11 and R12 of FIG. 5) are omitted compared to the first transmission driver 110 of. FIG. 5.

Although not shown, other transmission drivers corresponding to the second and third transmission drivers 120 and 130 of FIG. 5) may be configured in substantially the same manner as the first transmission driver 110 illustrated in FIG. 11.

Figure 12:
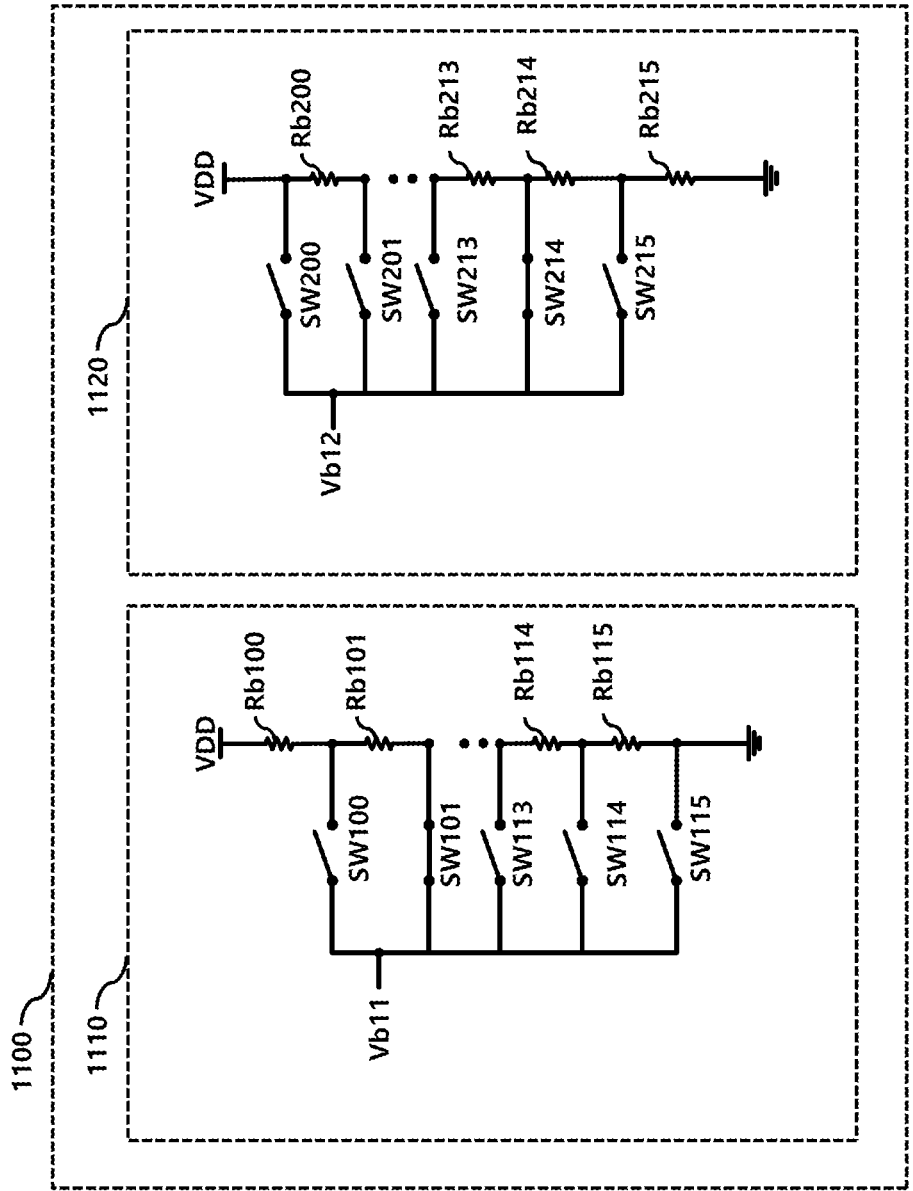
FIG. 12 is a circuit diagram illustrating a bulk control signal generation unit according to an embodiment.

FIG. 12 is a circuit diagram of a bulk control signal generation circuit 1100 according to an embodiment.

The bulk control signal generation circuit 1100 includes a first bulk control signal generator 1110 and a second bulk control signal generator 1120.

The first bulk control signal generator 1110 includes a plurality of resistors Rb100 to Rb115 connected in series between a supply voltage VDD and a ground and a plurality of switches SW100 to SW115 configured to select voltages divided by the plurality of resistors Rb100 to Rb115.

Any one of the switches is turned on to output a first bulk control signal Vb11. In an embodiment, the first bulk control signal generator 1110 receives a first switching signal, and one of the plurality of switches SW100 to SW115 is turned on in response to the received first switching signal to couple a corresponding node to an output terminal of the first bulk control signal generator 1110. As a result, the first bulk control signal generator 1110 outputs a selected voltage at the corresponding node as the first bulk control signal Vb11 from the output terminal.

The second bulk control signal generator 1120 includes a plurality of resistors Rb200 to Rb215 connected in series between the supply voltage VDD and the ground and a plurality of switches SW200 to SW215 configured to select voltages divided by the plurality of resistors Rb200 to Rb215.

Any one of the switches is turned on to output a second bulk control signal Vb12. In an embodiment, the second bulk control signal generator 1120 receives a second switching signal, and one of the plurality of switches SW200 to SW215 is turned on in response to the received second switching signal to couple a corresponding node to an output terminal of the second bulk control signal generator 1120. As a result, the second bulk control signal generator 1120 outputs a selected voltage at the corresponding node as the second bulk control signal Vb12 from the output terminal.

Another bulk control signal generation circuit for the second or third transmission driver 120 or 130 of FIG. 5 may have substantially the same configuration as the bulk control signal generation circuit 1100.

According to embodiments of the present disclosure, a transmitter and a system may include a transmission driver and an active inductor circuit, and thus increase a bandwidth of a transmitted signal.

The transmitter and the system may include driving resistors and termination resistors, each of which has a resistance value greater than a corresponding resistor in a conventional transmitter. Therefore, the transmitter and the system can reduce current consumption while substantially preventing degradation of signal quality.

The transmitter and the system may include a second active inductor circuit through which a constant current flows to substantially prevent floating of a common node, instead of a transmission driver through which a constant current flows, thereby further reducing the current consumption.

Although various embodiments have been described for illustrative purposes, it will be apparent to those skilled in the art that various changes and modifications may be made without departing from the spirit and scope of the invention as defined in the following claims.

What is claimed is:

1. A transmitter comprising:
a first transmission driver configured to drive a first transmission line according to a first input signal;
a second transmission driver configured to drive a second transmission line according to a second input signal;
a third transmission driver configured to drive a third transmission line according to a third input signal;
a first active inductor circuit coupled to an output terminal of the first transmission driver;
a second active inductor circuit coupled to an output terminal of the second transmission driver; and
a third active inductor circuit coupled to an output terminal of the third transmission driver.

2. The transmitter of claim 1, wherein when a signal is transmitted, the first transmission driver drives the first transmission line, the second transmission driver drives the second transmission line, and the third transmission driver sets a terminal of the third transmission line in a floating state, the terminal of the third transmission line being coupled to a common node, and
wherein the third active inductor circuit maintains a voltage level at the terminal of the third transmission line substantially constant.

3. The transmitter of claim 2, wherein the first transmission driver provides a first current, and the first active inductor circuit receives the first current and sinks a second current, so that a third current is provided to the first transmission line,
wherein the second active inductor circuit receives the third current, sources the second current, and provides the first current to the second transmission driver, and the second transmission driver causes the first current to flow into a ground, and
wherein the third active inductor circuit includes a first active inductor and a second active inductor, and a fourth current flows from a supply voltage to the ground through the first and second active inductors.

4. The transmitter of claim 3, wherein the fourth current has a smaller magnitude than the second current.

5. The transmitter of claim 1, wherein the first transmission driver comprises:

a first PMOS transistor having a source and a drain, the source being coupled to a supply voltage, the drain being coupled to the output terminal of the first transmission driver; and a first NMOS transistor having a drain and a source, the drain being coupled to the output terminal of the first transmission driver, the source being coupled to a ground, wherein the first input signal includes a first gate signal and a second gate signal, a gate of the first PMOS transistor receiving the first gate signal, and a gate of the first NMOS transistor receiving the second gate signal.

6. The transmitter of claim 5, wherein a back gate of the first PMOS transistor receives a first bulk control signal, a back gate of the first NMOS transistor receives a second bulk control signal, the first bulk control signal controls a value of a turn-on resistance of the first PMOS transistor, and the second bulk control signal controls a value of a turn-on resistance of the first NMOS transistor.

7. The transmitter of claim 6, further comprising a bulk control signal generation circuit configured to generate the first bulk control signal and the second bulk control signal.

8. The transmitter of claim 5, further comprising;
a first resistor coupled between the drain of the first PMOS transistor and the output terminal of the first transmission driver; and
a second resistor coupled between the drain of the first NMOS transistor and the output terminal of the first transmission driver.

9. The transmitter of claim 5, wherein the first active inductor circuit comprises:
a second PMOS transistor having a source coupled to the supply voltage;
a first active inductor coupled between a drain of the second PMOS transistor and the output terminal of the first transmission driver;
a second NMOS transistor having a source coupled to the ground; and
a second active inductor coupled between a drain of the second NMOS transistor and the output terminal of the first transmission driver.

10. The transmitter of claim 9, wherein the first active inductor comprises a first resistor and a third PMOS transistor having a source and a drain, the source of the third PMOS transistor being coupled to the drain of the second PMOS transistor, the drain of the third PMOS transistor being coupled to the output terminal of the first transmission driver, the first resistor being coupled between a gate and the drain of the third PMOS transistor, and
wherein the second active inductor comprises a second resistor and a third NMOS transistor having a source and a drain, the source of the third NMOS transistor being coupled to the drain of the second NMOS transistor, the drain of the third NMOS transistor being coupled to the output terminal of the first transmission driver, the second resistor being coupled between a gate and the drain of the third NMOS transistor.

11. The transmitter of claim 9, wherein when the first PMOS transistor is turned on and the first NMOS transistor is turned off, the second PMOS transistor is turned off, and the second NMOS transistor is turned on,
wherein when the first PMOS transistor is turned off and the first NMOS transistor is turned on, the second PMOS transistor is turned on, and the second NMOS transistor is turned off, and wherein when the first PMOS transistor is turned off and the first NMOS transistor is turned off, the second PMOS transistor is turned on, and the second NMOS transistor is turned on.

12. A system comprising a transmitter, a receiver, and first, second, and third transmission lines, the first, second, and third transmission lines being configured to couple the transmitter and the receiver,
wherein the transmitter comprises:
a first transmission driver configured to drive a first transmission line according to a first input signal;
a second transmission driver configured to drive a second transmission line according to a second input signal;
a third transmission driver configured to drive a third transmission line according to a third input signal;
a first active inductor circuit coupled to an output terminal of the first transmission driver;
a second active inductor circuit coupled to an output terminal of the second transmission driver; and
a third active inductor circuit coupled to an output terminal of the third transmission driver, and
wherein the receiver comprises:
a first termination resistor coupled between a first terminal of the first transmission line and a common node;
a second termination resistor coupled between a first terminal of the second transmission line and the common node; and
a third termination resistor coupled between a first terminal of the third transmission line and the common node.

13. The system of claim 12, wherein when a signal is transmitted, the first transmission driver drives the first transmission line, the second transmission driver drives the second transmission line, and the third transmission driver sets a second terminal of the third transmission line in a floating state, the second terminal of the third transmission line being coupled to the output terminal of the third transmission driver, and
wherein the third active inductor circuit maintains a voltage level at the second terminal of the third transmission line substantially constant.

14. The system of claim 13, wherein the first transmission driver provides a first current, and the first active inductor circuit receives the first current and sinks a second current, so that a third current is provided to the first transmission line,
wherein the second active inductor circuit receives the third current, sources the second current, and provides the first current to the second transmission driver, and the second transmission driver causes the first current to flow into a ground, and
wherein the third active inductor circuit includes a first active inductor and a second active inductor, and a fourth current flows from a supply voltage to the ground through the first and second active inductors.

15. The system of claim 14, wherein the fourth current has a smaller magnitude than the second current.

16. The system of claim 14, wherein a first voltage at the first terminal of the first transmission line is a first output voltage, a second voltage at the first terminal of the second transmission line is a second output voltage, and a third voltage at the first terminal of the third transmission line is a third output voltage, and
wherein the first output voltage of the first transmission line is higher than the third output voltage of the third transmission line, and the second output voltage of the second transmission line is lower than the third output voltage of the third transmission line.

17. The system of claim 16, wherein the third output voltage of the third transmission line is substantially equal to a half of the supply voltage.

18. The system of claim 12, wherein a first voltage at the first terminal of the first transmission line is a first output voltage, a second voltage at the first terminal of the second transmission line is a second output voltage, and a third voltage at the first terminal of the third transmission line is a third output voltage, and wherein the receiver further comprises:
a first reception driver configured to compare the first output voltage of the first transmission line to the second output voltage of the second transmission line, and output a first comparison result;
a second reception driver configured to compare the second output voltage of the second transmission line to the third output voltage of the third transmission line, and output a second comparison result; and
a third reception driver configured to compare the third output voltage of the third transmission line to the first output voltage of the first transmission line, and output a third comparison result.

19. The system of claim 12, wherein the first termination resistor has an impedance value greater than a characteristic impedance value of the first transmission line.

20. The system of claim 12, wherein the first transmission driver has an output impedance value greater than a characteristic impedance value of the first transmission line.

* * * * *